United States Patent
Gu

(10) Patent No.: US 10,790,468 B2
(45) Date of Patent: Sep. 29, 2020

(54) ORGANIC ELECTROLUMINESCENT DEVICE AND METHOD FOR PREPARING THE SAME

(71) Applicant: Wuhan China Star Optoelectronics Semiconductor Display Technology Co., Ltd., Wuhan (CN)

(72) Inventor: Yu Gu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/467,041

(22) PCT Filed: Mar. 19, 2019

(86) PCT No.: PCT/CN2019/078597
§ 371 (c)(1),
(2) Date: Jun. 6, 2019

(87) PCT Pub. No.: WO2020/107750
PCT Pub. Date: Jun. 4, 2020

(65) Prior Publication Data
US 2020/0185637 A1    Jun. 11, 2020

(30) Foreign Application Priority Data
Nov. 26, 2018    (CN) .......................... 2018 1 1416263

(51) Int. Cl.
*H01L 51/52* (2006.01)
*H01L 51/00* (2006.01)
*H01L 51/56* (2006.01)

(52) U.S. Cl.
CPC ...... *H01L 51/5206* (2013.01); *H01L 51/0015* (2013.01); *H01L 51/56* (2013.01); *H01L 2251/308* (2013.01)

(58) Field of Classification Search
CPC ............. H01L 51/5206; H01L 51/5212; H01L 51/5218; H01L 51/5215; H01L 2251/305; H01L 2251/308
See application file for complete search history.

(56) References Cited

U.S. PATENT DOCUMENTS 9,214,645 B1    12/2015 Li et al.
10,431,702 B2 * 10/2019 Shida .................. H01L 51/5215
2012/0168755 A1    7/2012 Choi

FOREIGN PATENT DOCUMENTS

| CN | 104167496 | 11/2014 |
| CN | 104752621 | 7/2015 |
| CN | 107452881 | 12/2017 |

* cited by examiner

*Primary Examiner* — Thanhha S Pham

(57) ABSTRACT

An organic electroluminescent device is provided, including a substrate and a composite anode structure disposed thereon, wherein the composite anode structure includes a lower metal oxide layer, a metallic silver layer and an upper metal oxide layer, wherein metallic silver at portions of a surface of the metallic silver layer which are not covered by the upper metal oxide due to defects of the upper metal oxide layer includes silver oxide. During the preparation of the organic electroluminescent device, the substrate is stored in the atmosphere for a long time while maintaining the performance of the substrate substantially unchanged, thereby improving the performance and the yield of the device.

10 Claims, 1 Drawing Sheet

ORGANIC ELECTROLUMINESCENT DEVICE AND METHOD FOR PREPARING THE SAME

RELATED APPLICATIONS

This application is a National Phase of PCT Patent Application No. PCT/CN2019/078597 having International filing date of Mar. 19, 2019, which claims the benefit of priority of Chinese Patent Application No. 201811416263.5 filed on Nov. 26, 2018. The contents of the above applications are all incorporated by reference as if fully set forth herein in their entirety.

FIELD AND BACKGROUND OF THE INVENTION

The present invention generally relates to the display technology and, more particularly, to an organic electroluminescent device and a method for preparing the same.

The organic electroluminescent device (OELD) has attracted the attention of many display panel preparers because of its advantages such as self-luminescence, light weight, small thickness, wide viewing angle, fast response, high luminescent efficiency, wide temperature range, low driving voltage, low energy consumption, and the feasibility of preparing flexible displays, and has thus been regarded as the next-generation mainstream display technology.

It is known that, in the structure of a conventional electroluminescent device, as shown in FIG. 1, a TCO/Ag/TCO (transparent conducting oxide) type composite anode structure is generally employed on the substrate 10'. After the composite anode structure is formed, a photoresist (PR) protective layer is usually provided to protect the composite anode structure, and a chemical physical stripping process is performed before evaporation to remove the PR protective layer.

However, for general experimental or mass production apparatuses, the evaporation apparatus and the stripping machine are separated from each other. The substrate after the stripping treatment needs to be stored for a certain time period before being subjected to the evaporation treatment. In order to improve the efficiency of the OELD, the upper TCO layer 15' of the composite anode structure is made very thin. Because the island-shaped upper TCO layer 15' is prone to defects 152', metallic silver on the surface of the metallic silver layer 13' thereunder is exposed. Due to the existence of a small amount of sulfur in the air atmosphere, the exposed silver reacts with sulfur to form black, non-conductive silver sulfide ($Ag_2S$), which causes defects on the substrate and further lowers the efficiency of the prepared OELD or even makes the OELD unable to illuminate.

Therefore, there is a need to develop a novel organic electroluminescent device and a method for preparing the same to overcome the drawbacks of the prior art.

SUMMARY OF THE INVENTION

One aspect of the present invention provides an organic electroluminescent device, capable of storing the substrate in the atmosphere for a long time while maintaining the performance of the substrate substantially unchanged, thereby improving the performance and the yield of the device.

The present invention adopts the technical solution as follows:

An organic electroluminescent device, including a substrate and a composite anode structure disposed thereon, wherein the composite anode structure comprises a lower metal oxide layer, a metallic silver layer and an upper metal oxide layer, wherein metallic silver at portions of a surface of the metallic silver layer which are not covered by the upper metal oxide due to defects of the upper metal oxide layer comprises silver oxide ($Ag_2O$).

Further, in other embodiments, the upper metal oxide layer includes indium-tin oxide.

Further, in other embodiments, the upper metal oxide layer includes indium-zinc oxide.

Further, in other embodiments, the lower metal oxide layer includes indium-tin oxide.

Further, in other embodiments, the lower metal oxide layer includes indium-zinc oxide.

Further, in other embodiments, the upper metal oxide layer and the lower metal oxide layer include the same metal oxide.

Further, in other embodiments, the silver oxide on the surface of the metallic silver layer is formed by irradiating the surface of the composite anode structure with ultraviolet rays.

Further, in other embodiments, the silver oxide on the surface of the metallic silver layer is formed by treating the surface of the composite anode structure with oxygen plasma.

Further, in other embodiments, the substrate is provided thereon with a hole injection layer, a hole transport layer, an electron blocking layer, a light-emitting layer, a hole blocking layer, an electron transport layer, an electron injection layer, a cathode, an optical coupling layer, and a packaging layer in sequence.

Further, another aspect of the present invention provides a method for preparing an organic electroluminescent device according to the present invention, including the following steps:

an anode preparation step by providing a substrate, forming a composite anode structure composed of a lower metal oxide layer, a metallic silver layer, and an upper metal oxide layer on the substrate, and a photoresist (PR) protective layer disposed thereon, and stripping off the PR protective layer; and an oxidation step by oxidizing the substrate to form silver oxide from metallic silver at portions of a surface of the metallic silver layer which are exposed to an outside due to defects of the upper metal oxide layer.

Further, in other embodiments, the oxidation step is performed by placing the substrate in an ultraviolet ozone treatment apparatus, irradiating the substrate with an ultraviolet lamp, and generating ozone by irradiating oxygen using ultraviolet light to oxidize the metallic silver uncovered by the upper metal oxide layer to form silver oxide.

Further, in other embodiments, the oxidation step is performed by placing the substrate in an oxygen plasma treatment apparatus, generating a large amount of ozone when the surface of the substrate is treated by oxygen plasma, and oxidizing the metallic silver uncovered by the upper metal oxide layer using ozone to form silver oxide.

Further, in other embodiments, the method further includes a functional layer preparation step by evaporating a hole injection layer, a hole transport layer, an electron blocking layer, a light-emitting layer, a hole blocking layer, an electron transport layer, an electron injection layer, a cathode, and an optical coupling layer in sequence, and finally packaging to complete the organic electroluminescent device.

Compared with the prior art, the present invention has an advantageous effect that, in the preparation of the organic electroluminescent device provided by the present invention, the substrate is the oxidized to form silver oxide on the surface of the uncovered metallic silver layer due to the defects of the upper metal oxide layer in the composite anode structure, so that the substrate is stored in the atmosphere for a long time without reacting with sulfur in the atmosphere to form silver sulfide to avoid sulfurizing the metallic silver on the anode to cause defects of the device, thereby improving the performance and the yield of the device.

Further, the method for preparing the organic electroluminescent device according to the present invention uses simple and easy processes, and is suitable for various composite anode structures with TCO/Ag/TCO, and can effectively avoid silver sulfide defects appearing in the conventional process. Therefore, the substrate after the stripping of the PR protective layer is easier to be stored.

BRIEF DESCRIPTION OF THE SEVERAL VIEWS OF THE DRAWINGS

In order to more clearly illustrate the technical solutions in the embodiments or the prior art, the drawings used in the embodiments or the prior art description will be briefly described below. Obviously, the drawings in the following description are only some implementations of the present invention. For example, other drawings may be acquired, without creative efforts, by those of ordinary skill in the art in light of the inventive work.

DESCRIPTION OF SPECIFIC EMBODIMENTS OF THE INVENTION

The technical solutions of an organic electroluminescent device and a method for preparing the same according to the present invention will be further described in detail below with reference to the accompanying drawings and embodiments.

Figure 1:
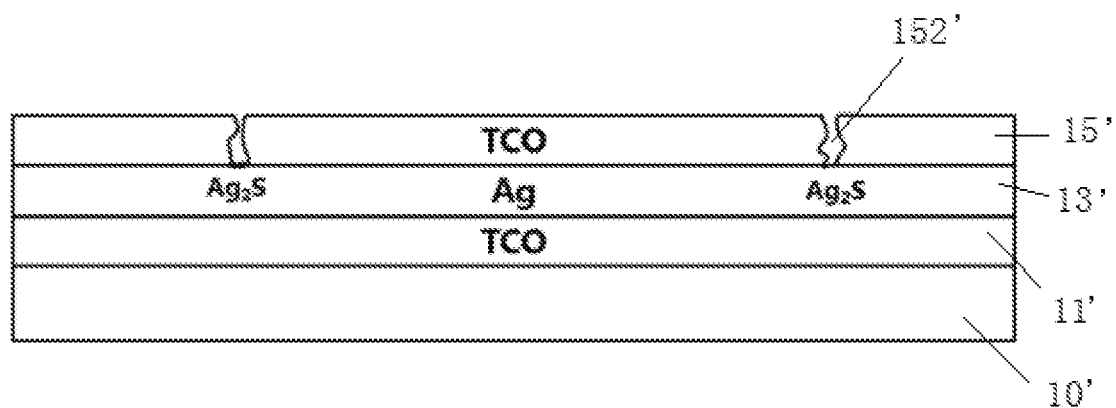
FIG. 1 is a schematic cross-sectional view of a substrate with a composite anode structure of a conventional organic electroluminescent device.
Figure 2:
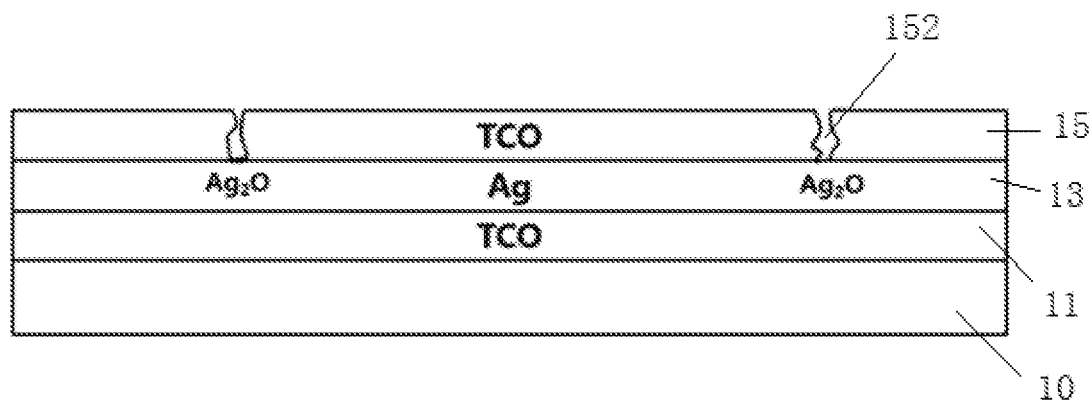
FIG. 2 is a schematic cross-sectional view of a substrate with a composite anode structure of an organic electroluminescent device according to one embodiment of the present invention.

Referring to FIG. 2, one embodiment of the present invention provides an organic electroluminescent device, which includes a substrate 10 and a composite anode structure disposed thereon.

The composite anode structure includes a lower metal oxide layer 11, a metallic silver layer 13, and an upper metal oxide layer 15. The uncovered metallic silver on the surface of the metallic silver layer 13 due to defects of the upper metal oxide layer 15 is oxidized to form silver oxide ($Ag_2O$) exposed to the atmosphere and covering the metallic silver thereunder.

After the metallic silver on the surface of the metallic silver layer 13 exposed due to the defect 152 of the upper oxide layer 15 is oxidized to form silver oxide, the resistivity of silver about $1.6 \times 10^{-8}$ $\Omega \cdot m$ is changed to the resistivity of silver oxide about $1 \times 10^{-4}$ $\Omega \cdot m$, which is not much different from the resistivity of the upper metal oxide (TCO). For example, when the TCO employs ITO (indium-tin oxide), the resistivity is about $5 \times 10^{-4}$ $\Omega \cdot m$, which is not much different from the resistivity of silver oxide. However, the resistivity of silver sulfide is about $10 \times 10^6$ $\Omega \cdot m$, which is almost non-conductive. Therefore, after the exposed metallic silver is oxidized to form silver oxide, the performance of the device is nearly unaffected. At the same time, silver oxide does react with sulfur to form silver sulfide under normal conditions, thus avoiding the formation of silver sulfide, thereby enabling the substrate 10 to be stored in the atmosphere for a relatively long time after the PR protective layer is stripped off.

Further, in different embodiments, the substrate is provided thereon with a hole injection layer, a hole transport layer, an electron blocking layer, a light-emitting layer, a hole blocking layer, an electron transport layer, an electron injection layer, a cathode, an optical coupling layer, and a packaging layer in sequence.

Further, one embodiment of the present invention provides a method for preparing an organic electroluminescent device according to the present invention, which includes the following steps:

A substrate is provided, on which are formed a composite anode structure and a PR protective layer thereon. The composite anode structure includes a lower metal oxide layer, an intermediate metallic silver layer, and an upper metal oxide layer. The upper metal oxide layer and the lower metal oxide layer are made of ITO. Then, the PR protective layer is stripped off.

The substrate is placed in an ultraviolet ozone treatment apparatus for treatment. Under the irradiation of an ultraviolet lamp, the ultraviolet light incident on the surface of the substrate can not only remove the residual organic matter on the substrate, but also allow ultraviolet light to irradiate oxygen to generate ozone. The metallic silver on the surface of the metallic silver layer uncovered by the upper metal oxide layer due to the defects of the upper metal oxide layer is easily oxidized to form silver oxide upon encountering ozone. Silver oxide itself does not react with sulfur in the atmosphere to form silver sulfide under normal conditions, which, at the same time, protects the metallic silver underneath from being sulfurized. Meanwhile, since silver oxide and ITO have similar resistivities, the performance of the device is not significantly affected. The substrate can be placed in the atmosphere for a long time for standby use after the oxidation treatment.

The substrate is pre-treated before evaporating the functional layer, for example, cleaning, baking, anodizing, etc.

On the substrate are evaporated a hole injection layer, a hole transport layer, an electron blocking layer, a light-emitting layer, a hole blocking layer, an electron transport layer, an electron injection layer, a cathode, and an optical coupling layer in sequence. Finally, the substrate is packaged to complete the organic electroluminescent device.

Further, still another embodiment of the present invention provides a preparation method for preparing the organic electroluminescent device, which includes the following steps:

A substrate is provided, on which are formed a composite anode structure and a PR protective layer thereon. The composite anode structure includes a lower metal oxide layer, an intermediate metallic silver layer, and an upper metal oxide layer. The upper metal oxide layer and the lower metal oxide layer are made of ITO. Then, the PR protective layer is stripped off.

The substrate is placed in an oxygen plasma treatment apparatus for oxygen plasma treatment, which can not only remove the residual organic matter on the substrate, but also generate a large amount of ozone. The metallic silver on the surface of the metallic silver layer uncovered by the upper metal oxide layer due to the defects of the upper metal oxide layer is easily oxidized to form silver oxide upon encountering ozone. Silver oxide itself does not react with sulfur in the atmosphere to form silver sulfide under normal conditions, which, at the same time, protects the metallic silver underneath from being sulfurized. Meanwhile, since silver oxide and ITO have similar resistivities, the performance of the device is not significantly affected. The substrate can be placed in the atmosphere for a long time for standby use after the oxidation treatment.

The substrate is pre-treated before evaporating the functional layer, for example, cleaning, baking, anodizing, etc.

On the substrate are evaporated a hole injection layer, a hole transport layer, an electron blocking layer, a light-emitting layer, a hole blocking layer, an electron transport layer, an electron injection layer, a cathode, and an optical coupling layer in sequence. Finally, the substrate is packaged to complete the organic electroluminescent device.

In the preparation of the organic electroluminescent device provided by the present invention, the substrate is the oxidized to form silver oxide on the surface of the uncovered metallic silver layer due to the defects of the upper metal oxide layer in the composite anode structure, so that the substrate is stored in the atmosphere for a long time without reacting with sulfur in the atmosphere to form silver sulfide to avoid sulfurizing the metallic silver on the anode to cause defects of the device, thereby improving the performance and the yield of the device.

Further, the method for preparing the organic electroluminescent device according to the present invention uses simple and easy processes, and is suitable for various composite anode structures with TCO/Ag/TCO, and can effectively avoid silver sulfide defects appearing in the conventional process. Therefore, the substrate after the stripping of the PR protective layer is easier to be stored.

The technical scope of the present invention is not limited to the contents of the above description. Various changes and modifications may be made by those with ordinary skill in the art without departing from the spirit and scope of the present invention. Changes and modifications are intended to be included within the scope of the instant disclosure as defined by the appended claims.

What is claimed is:

1. An organic electroluminescent device, comprising a substrate and a composite anode structure disposed thereon, wherein the composite anode structure comprises a lower metal oxide layer, a metallic silver layer and an upper metal oxide layer, wherein metallic silver at portions of a surface of the metallic silver layer which are not covered by the upper metal oxide due to defects of the upper metal oxide layer comprises silver oxide.

2. The organic electroluminescent device according to claim 1, wherein the upper metal oxide layer comprises indium-tin oxide.

3. The organic electroluminescent device according to claim 1, wherein the upper metal oxide layer comprises indium-zinc oxide.

4. The organic electroluminescent device according to claim 1, wherein the lower metal oxide layer comprises indium-tin oxide.

5. The organic electroluminescent device according to claim 1, wherein the lower metal oxide layer comprises indium-zinc oxide.

6. The organic electroluminescent device according to claim 1, wherein the upper metal oxide layer and the lower metal oxide layer comprise the same metal oxide.

7. The organic electroluminescent device according to claim 1, wherein the substrate is further provided with a hole injection layer, a hole transport layer, an electron blocking layer, a light-emitting layer, a hole blocking layer, an electron transport layer, an electron injection layer, a cathode, an optical coupling layer, and a packaging layer in sequence.

8. A method for preparing an organic electroluminescent device according to claim 1, comprising the following steps:
   an anode preparation step by providing a substrate, forming a composite anode structure composed of a lower metal oxide layer, a metallic silver layer, and an upper metal oxide layer on the substrate, and a photoresist (PR) protective layer disposed thereon, and stripping off the PR protective layer; and
   an oxidation step by oxidizing the substrate to form silver oxide from metallic silver at portions of a surface of the metallic silver layer which are exposed to an outside due to defects of the upper metal oxide layer.

9. The method for preparing an organic electroluminescent device according to claim 8, wherein the oxidation step is performed by placing the substrate in an ultraviolet ozone treatment apparatus, irradiating the substrate with an ultraviolet lamp, and generating ozone by irradiating oxygen using ultraviolet light to oxidize the metallic silver uncovered by the upper metal oxide layer to form silver oxide.

10. The method for preparing an organic electroluminescent device according to claim 8, wherein the oxidation step is performed by placing the substrate in an oxygen plasma treatment apparatus, generating a large amount of ozone when the surface of the substrate is treated by oxygen plasma, and oxidizing the metallic silver uncovered by the upper metal oxide layer using ozone to form silver oxide.

* * * * *